(12) United States Patent
Tang et al.

(10) Patent No.: US 12,550,607 B2
(45) Date of Patent: Feb. 10, 2026

(54) PEROVSKITE PRECURSOR SOLUTION FOR IMPROVING STABILITY OF PEROVSKITE SOLAR CELL

(71) Applicant: SOOCHOW UNIVERSITY, Suzhou (CN)

(72) Inventors: Jianxin Tang, Suzhou (CN); Yanqing Li, Suzhou (CN); Li Chen, Suzhou (CN); Jingde Chen, Suzhou (CN)

(73) Assignee: SOOCHOW UNIVERSITY, Suzhou (CN)

( * ) Notice: Subject to any disclaimer, the term of this patent is extended or adjusted under 35 U.S.C. 154(b) by 494 days.

(21) Appl. No.: 18/010,151

(22) PCT Filed: Nov. 26, 2020

(86) PCT No.: PCT/CN2020/131969
§ 371 (c)(1),
(2) Date: Dec. 13, 2022

(87) PCT Pub. No.: WO2021/258630
PCT Pub. Date: Dec. 30, 2021

(65) Prior Publication Data
US 2023/0225193 A1  Jul. 13, 2023

(30) Foreign Application Priority Data
Jun. 27, 2020 (CN) .......................... 202010593693.5

(51) Int. Cl.
*H10K 85/50* (2023.01)
*H10K 71/12* (2023.01)
*H10K 71/40* (2023.01)

(52) U.S. Cl.
CPC ............. *H10K 85/50* (2023.02); *H10K 71/12* (2023.02); *H10K 71/40* (2023.02)

(58) Field of Classification Search
CPC ........ H10K 85/50; H10K 71/12; H10K 71/40; H10K 71/15; H10K 30/151; H10K 30/00; H10K 85/30; Y02E 10/549; Y02P 70/50
See application file for complete search history.

(56) References Cited

FOREIGN PATENT DOCUMENTS

| | | | |
|---|---|---|---|
| CN | 104876275 A | 9/2015 | |
| CN | 107325812 A | * 11/2017 | ........... C01G 17/006 |

(Continued)

OTHER PUBLICATIONS

"Wen Tianyu", "Optimization of Perovskite Thin Film Crystallization and Solar Cell Performance Through Adding m-Chloroaniline", "Highlights of Science Paper Online", vol. 10, Issue 24, 2761-2767 (Year: 2017).*

(Continued)

*Primary Examiner* — Ermias T Woldegeorgis
(74) *Attorney, Agent, or Firm* — SZDC Law PC

(57) ABSTRACT

Disclosed is a perovskite precursor solution for improving stability of a perovskite solar cell. Iodoformamidine and cesium iodide are added into a solvent, and bromomethylamine, lead iodide and 3,4-dichloroaniline are added after stirring to obtain the perovskite precursor solution. The perovskite precursor solution is spin-coated on a substrate, obtaining a perovskite thin film by thermal annealing as a light absorption layer of the solar cell. The perovskite precursor solution prepared by the present invention replaces an existing perovskite layer, the defects in the existing perovskite mineralization technology are solved. The perovskite stability improvement leads lower requirements for the process environment and convenient preparation method, realizes the long-time stable performance in a common environment.

7 Claims, 2 Drawing Sheets

(56) References Cited

FOREIGN PATENT DOCUMENTS

| | | | |
|---|---|---|---|
| CN | 111740015 A | 10/2020 | |
| CN | 111740016 A | 10/2020 | |

OTHER PUBLICATIONS

Tianyu Wen et al., "Optimization of perovskite thin films crystallization and device performance through adding m-chloroaniline" Highlights of Sciencepaper Online, vol. 10, No. 24, pp. 2761-2850 (Dec. 31, 2017).

* cited by examiner

PEROVSKITE PRECURSOR SOLUTION FOR IMPROVING STABILITY OF PEROVSKITE SOLAR CELL

This application is the National Stage Application of PCT/CN2020/131969, filed on Nov. 26, 2020, which claims priority to Chinese Patent Application No. 202010593693.5, filed on Jun. 27, 2020, which is incorporated by reference for all purposes as if fully set forth herein.

TECHNICAL FIELD

The present invention relates to solar technology, and specifically to a perovskite precursor solution for improving the stability of a perovskite solar cell.

BACKGROUND

As a stable clean energy source, solar energy has become a research focus of global scientific and industrial research. In today's solar cell market, silicon crystalline solar cells occupy a large share. After a long period of exploration and development, solar cells with silicon crystal as the core can have good and stable photoelectric conversion efficiency, but the shortcomings, such as high manufacture, maintenance and recycling costs, strict preparation condition, low recycling efficiency and low recycling cost, remain. A new generation of photoelectric conversion materials has emerged. Among them, perovskite material-based solar cells based on the $ABX_3$ structure (A represents cation methylamine, formamidine, metal cesium, etc.; B represents metal cations such as lead, tin, bismuth, etc.; X represents a halogen) have great development potential. The perovskite light-absorbing layer of positive phase crystal structure is the core of this type of solar cell. Compared with other optoelectronic materials, the light-absorbing layer of this perovskite solar cell has low cost, simple and fast manufacturing process, large open circuit voltage, and high spectral density. The photoelectric conversion efficiency of this kind of perovskite solar cell is higher than that of other solar cells. However, this material also has drawbacks. The material has high sensitivity to humidity and temperature. For example, the perovskite solar cell of a single-phase mixed cation system needs to be prepared in an anhydrous and oxygen-free low-temperature environment during the preparation process. When in use, if it is affected by fluctuations in environmental factors, the performance of battery devices will be greatly depleted. At present, the research on this material has made some progress, but the industrialization and the stability of the device still need to be developed.

TECHNICAL PROBLEM

The objective of the present invention is to provide a perovskite precursor solution for improving the stability of a perovskite solar cell in order to overcome the defects in the existing perovskite mineralization technology and to realize a perovskite stability improvement means for maintaining a stable long-term character in a common environment.

TECHNICAL SOLUTION

The present application adopts the following technical scheme: the perovskite precursor for improving the stability of the perovskite solar cell includes bromomethylamine, iodoformamidine, lead iodide, cesium iodide and 3,4-dichloroaniline, and an amount of the 3,4-dichloroaniline is 0.6% -1.15% of an amount of cesium iodide, the iodoformamidine, lead iodide and cesium iodide.

The perovskite precursor solution for improving the stability of the perovskite solar cell includes a perovskite precursor for improving the stability of the perovskite solar cell and a solvent; the perovskite precursor for improving the stability of the perovskite solar cell includes bromomethylamine, iodoformamidine, lead iodide, cesium iodide and 3,4-dichloroaniline. An amount of 3,4-dichloroaniline is 0.63-1.12%, preferably 0.8-1.05%, of an amount of brommethylamine, iodoformamidine, lead iodide, cesium iodide and cesium iodide. The solvent is a mixture of a sulfone solvent and an amide solvent, such as N,N-dimethylformamide and dimethyl sulfoxide; preferably, 70% -90% by volume of N,N-dimethylformamide, and 10% -30% of dimethyl sulfoxide.

A perovskite thin film for improving the stability of a perovskite solar cell: spin-coating the perovskite precursor solution for improving the stability of the perovskite solar cell on a substrate for annealing to obtain a perovskite thin film for improving the stability of the perovskite solar cell; and dropwise adding an anti-solvent before the spin coating is completed.

In the present invention, an amount of bromomethylamine, iodo-formamidine, lead iodide, cesium iodide, and cesium iodide is 100%; bromomethylamine is 1% -5%, iodo-formamidine is 10% -28%, lead iodide is 50% -80%, and cesium iodide is balance, preferably, bromomethylamine is 1.5% -2%, iodoformamidine is 17% -22%, lead iodide is 65% -75%, and cesium iodide is balance.

In the perovskite precursor solution for improving the stability of the perovskite solar cell, a weight ratio of the perovskite precursor for improving the stability of the perovskite solar cell to the solvent is 1: (0.8-1.5).

Preferably, in the perovskite precursor for improving the stability of the perovskite solar cell, an amount of bromomethylamine, iodoformamidine, lead iodide and cesium iodide is 100%, the mass percentage, bromomethylamine is 1.83%, iodoformamidine is 20.16%, lead iodide is 71.91%, and cesium iodide is balance. 3,4-dichloroaniline is 1.02%. Additionally, dimethyl sulfoxide, N,N-dimethylformamide are added to the perovskite precursor for improving the stability of the perovskite solar cell to obtain a preferred perovskite precursor solution for improving the stability of the perovskite solar cell.

The invention further provides a method of preparing the perovskite precursor solution for improving the stability of the perovskite solar cell. The method includes the following steps: mixing bromomethyl amine, iodoformamidine, lead iodide, cesium iodide and 3,4-dichloroaniline with a solvent to obtain the perovskite precursor solution for improving the stability of the perovskite solar cell. Preferably, methyl iodide and cesium iodide are added into a solvent and stirred. Methyl bromide, lead iodide, and 3,4-dichloroaniline are added and stirred to obtain the perovskite precursor solution for improving the stability of the perovskite solar cell.

Specifically, (1) the dimethyl sulfoxide is weighed according to a weight ratio, N,N-dimethylformamide is added to the dimethyl sulfoxide according to a weight ratio, and the solution is stirred uniformly.

(2) The iodoformamidine and cesium iodide is weighed according to a weight ratio and added to the solution prepared in step (1), after complete dissolution of iodoformamidine and cesium iodide, bromomethylamine is added into the solution, raising the temperature of the solution to 45-70° C., and stirring for 10 min until the solution is completely dissolved.

(3) Lead iodide is added to the solution prepared in step (2), and 3,4-dichloroaniline is added to the solution and stirred until the solution is dissolved, keeping the solution at a constant temperature of 45-70° C. throughout the stirring process.

(4) The solution prepared in step (3) is continuously stirring at 45-70° C. for 12 hours to obtain a perovskite precursor solution for improving the stability of the perovskite solar cell.

The present application provides a perovskite precursor for improving the stability of the perovskite solar cell and an application of the perovskite precursor for improving the stability of the perovskite solar cell in preparing a perovskite solar cell, improving the stability of the perovskite solar cell.

The present application provides a method for improving the stability of the perovskite solar cell. The perovskite layer of the perovskite solar cell is prepared from the perovskite precursor for improving the stability of the perovskite solar cell, so that the stability of the perovskite solar cell is improved; and the inventive step involves replacing the existing perovskite precursor with the new perovskite precursor for preparing the perovskite layer for the solar cell, so that the stability of the perovskite solar cell can be effectively improved.

BENEFICIAL EFFECT

The present invention discloses, for the first time, a perovskite precursor solution for improving the stability of perovskite solar cells containing 3,4-dichloroaniline. The examples show that the additives have an optimized effect on perovskite, and this optimization result shows that the untreated perovskite crystal has a poor uniformity and the size of the grains is not uniform and the treated perovskite crystal has a good uniformity and the size of the grains is uniform. The photoelectric conversion efficiency of treated perovskite crystal is significantly higher than the photoelectric conversion efficiency of the untreated perovskite device. The open-circuit voltage or the short-circuit current density, these conventional parameters for measuring the performance of the solar cell, are also greatly improved after the perovskite is modified. Specifically, the solar cell life test results show that after the 3,4-dichloroaniline is added, the stability of the perovskite solar cell is greatly improved.

EMBODIMENTS OF THE INVENTION

Figure 1:
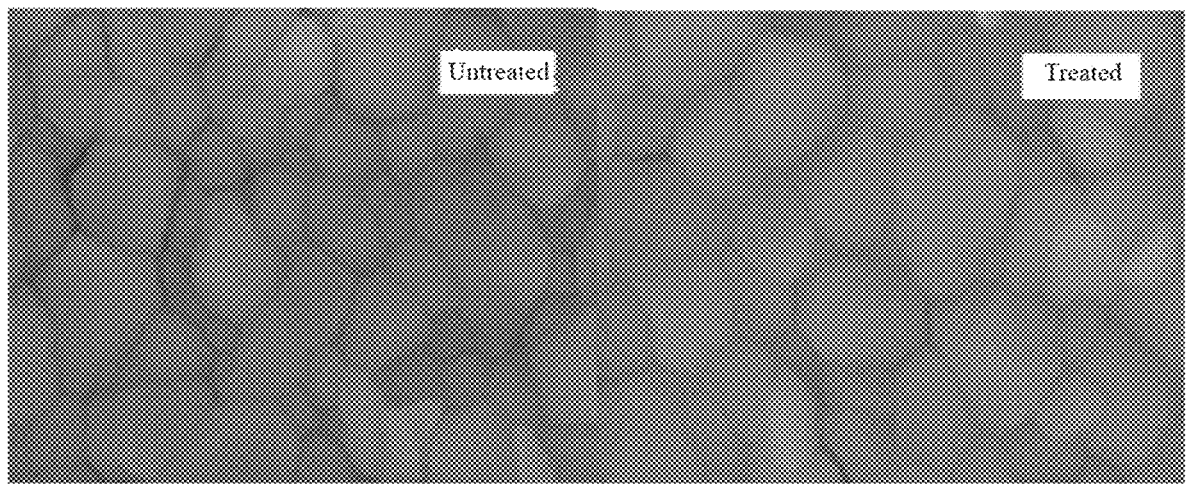
FIG. 1 shows morphology contrast of perovskite crystals that were not treated and treated with 3,4-dichloroaniline (scale: 200 nm).

The perovskite precursor for improving the stability of the perovskite solar cell includes bromomethylamine, iodoformamidine, lead iodide, cesium iodide and 3,4-dichloroaniline. Then, N,N-dimethylformamide and dimethyl sulfoxide are added to obtain a perovskite precursor solution for improving the stability of the perovskite solar cell.

The method of preparing the perovskite precursor solution for improving the stability of the perovskite solar cell includes the following steps: mixing brommethylamine, iodo-formamidine, lead iodide, cesium iodide and 3,4-dichloroaniline with a solvent to obtain the perovskite precursor solution for improving the stability of the perovskite solar cell; preferably, adding methyl iodide and cesium iodide into a solvent, stirring, adding methyl bromide, stirring, adding lead iodide, 3,4-dichloroaniline, and stirring to obtain the perovskite precursor solution for improving the stability of the perovskite solar cell.

All the starting materials are weighed in a glove box, and magnetic stirring is used in the stirring process.

All the starting materials of the present invention are commercially available products, and are conventional products for solar cells; and the related testing method is a conventional method in the art. For example, the method for testing the photoelectric conversion efficiency of the perovskite solar cell includes: placing the prepared battery in a solar cell test box, linking the test box with a digital source table Keithley-2400, opening test software, fixing the open-circuit voltage test range between −0.1 V-1.2 V, enabling the test range of the short-circuit current to be 0 mA/cm$^2$-30 mA/cm$^2$, opening the Newport sunlight simulator, and modulating the illumination power to AM1.5 (equivalent to one standard sun light). The corresponding matching test software is turned on to test the photoelectric conversion efficiency of the perovskite solar cell. During testing, the humidity and temperature of the environment are not controlled, and the specific humidity and temperature are changed according to the atmosphere environment atmosphere.

The method for testing the stability of the perovskite solar cell includes the following steps: placing the battery in a solar cell test box, wherein the test box is not additionally protected, so that the perovskite solar cell is exposed in air, keeping the humidity and the temperature consistent with the humidity and temperature in the atmospheric environment, and meanwhile, placing the test box in a standard sunlight, and performing a photoelectric conversion efficiency test on the perovskite solar cell every 12 hours. When the photoelectric conversion efficiency value of the perovskite solar cell to be unmodified is less than 1%, the service life test is stopped.

EXAMPLE 1

The perovskite precursor solution for improving the stability of perovskite solar cells included: 14.1 mg of bromomethylamine, 155.4 mg of iodoformamidine, 554.3 mg of lead iodide, 47 mg of cesium iodide, 7.86 mg (i.e., 1.02%) of 3,4-dichloroaniline, 200 mL of dimethyl sulfoxide, 800 mL of N,N-dimethylformamide.

The preparation method included: (1) N,N-dimethylformamide was added into dimethyl sulfoxide, and the solution was stirred uniformly.

(2) Iodoformamidine and cesium iodide were weighed, added to the solution of step (1), stirred for 10 min, then bromomethylamine was added to the solution, the temperature of the solution was increased to 50° C., and stirring was performed for 10 min.

(3) Lead iodide was added into the solution prepared in step (2), and then 3,4-dichloroaniline was added into the solution and stirring until the solution was dissolved; and the solution was kept at a constant temperature of 50° C. throughout the stirring process.

(4) the solution prepared in step (3) was continuously stirred at 50° C. for 12 hours to obtain a perovskite precursor solution for improving the stability of the perovskite solar cell.

The present application provided a perovskite precursor for improving the stability of the perovskite solar cell and an application of the perovskite precursor for improving the stability of the perovskite solar cell. The stability of the perovskite solar cell can be improved. See Applicant's concurrently filed application titled "a method for improving the stability of a perovskite solar cell" in the same day.

The above 3,4-dichloroaniline was replaced with 3,5-dichloroaniline, and the rest was unchanged to obtain an isomer perovskite precursor solution.

The amount of the 3,4-dichloroaniline described above was changed to 4.62 mg (0.6%), and the rest are unchanged, so as to obtain a deficient perovskite precursor solution.

The amount of the 3,4-dichloroaniline described above was changed by 8.87 mg (1.15%), and the rest are unchanged, so as to obtain an excess perovskite precursor solution.

EXAMPLE 2

The method for preparing the light absorption layer of the solar cell included: spin-coating the perovskite precursor solution for improving the stability of the perovskite solar cell in Example 1 on a substrate, and performing thermal annealing at 150° C. for 30 minutes to obtain the light absorption layer of the solar cell. The crystal morphology is shown in FIG. 1. Spin-coating included two steps, spin-coating at a speed of 1000 rpm for 10 seconds, spin-coating at a speed of 6000 rpm for 30 seconds, and dropwise adding 200 microliters of diethyl ether onto the rotating perovskite film at 15 seconds before spin coating.

The substrate was FTO glass coated with $TiO_2$ or ITO glass with $SnO_2$; the above operations were performed in the glove box with a water and oxygen content of less than 2 ppm.

EXAMPLE 3

The perovskite solar cell included a conventional substrate, an electron transport layer, a hole transport layer, an electrode and a perovskite layer. The perovskite layer was prepared from the perovskite precursor solution for improving the stability of the perovskite solar cell in Example 1.

The method of preparing the solar cell included the following steps: spin-coating the perovskite precursor solution for improving the stability of the perovskite solar cell in Example 1 on a substrate, carrying out thermal annealing at 150° C. for 30 minutes to obtain a light absorption layer of the solar cell, spin-coating into two steps, spin-coating at a speed of 1000 rpm for 10 seconds, spin-coating at a speed of 6000 rpm for 30 seconds, and dropwise adding diethyl ether before spin coating was finished; then preparing a hole transport layer on the light-absorbing layer, then placing the prepared device in a high-vacuum electrode vapor deposition instrument, evaporating a 110-nanometer thick silver electrode layer on the hole transport layer, and finally obtaining a perovskite solar cell. In the technical solution of the present invention, the perovskite precursor solution for improving the stability of the perovskite solar cell was subjected to immediate annealing treatment after spin-coating was completed, without the need for vacuum treatment or other pre-annealing volatile solvents in the prior art.

The substrate was FTO glass coated with $TiO_2$ or ITO glass with $SnO_2$, and was an existing product. The thickness of the electron transport layer $TiO_2$ or $SnO_2$ was 100 nm; the preparation was conducted in the glove box, the water and oxygen content was lower than 2 ppm.

Specifically, the specific preparation method of the solar cell included: (1) spin-coating the perovskite precursor solution of the first example on the FTO glass (or ITO glass) treated in step (1) at a speed of 1000 rpm at a speed of 1000 rpm for 30 seconds, and dropwise adding 200 microliters of diethyl ether onto the rotating perovskite film at 15 seconds before spin coating, and transferring the FTO glass (ITO glass) with the perovskite film after spin coating to a plate at 150° C. for annealing for 30 minutes.

(2) Spin-coating a hole transport layer material (Spiro-OMeTAD, 2,2',7,7'-tetra [N,N-bis(4-methoxyphenyl) amino]-9,9'-spirobifluorene solution) on the FTO glass treated in step (1), with a thickness of 80 nm, placing in a saturated oxygen environment for 1 min after spin coating, so as to obtain the solar cell semi-finished product, and then placing the prepared device in a high vacuum electrode vapor deposition instrument, evaporating a 110 nm thick silver electrode layer on the hole transport layer, and finally obtaining a perovskite solar cell complete device.

Hole Transport Layer Solution Preparation: 72.3 mg of Spiro-OMeTAD (2,2',7,7'-tetra[N,N-bis(4-methoxyphenyl) amino]-9,9'-spirobifluorene solution) was dissolved in ultra-dried chlorobenzene, 28.8 microliters of TBP (4-tert-butylpyridine) was added dropwise to a chlorobenzene solution containing Spiro-OMeTAD, and 17.5 microliters of Li-TFSI solution (520 mg/ml and acetonitrile as a solvent) was added dropwise into the chlorobenzene solution, and mixed and stirred for 8 hours to obtain a hole transport layer solution.

Comparing Solar Cells: Conducting Example 1, with 3,4-dichloroaniline not added, and the balance not changed, to obtain a comparison perovskite precursor solution.

Conducting Example 3, the perovskite precursor solution for improving the stability of the perovskite solar cell according to Example 1 of the perovskite precursor was replaced with the comparison perovskite precursor solution, and the rest was not changed to obtain a comparison solar cell.

Performance comparison: FIG. 1 shows the morphology and contrast ratio of untreated perovskite crystal and perovskite crystal treated with 3,4-dichloroaniline (scale: 200 nm). The uniformity of the untreated perovskite crystal was poor, and the sizes of the untreated crystal grains were different. The size of the treated perovskite crystal grain was almost similar, and the uniformity was good. The fluctuation degree of the surface of the untreated perovskite film was also larger than the fluctuation degree of the treated perovskite film.

Figure 2:
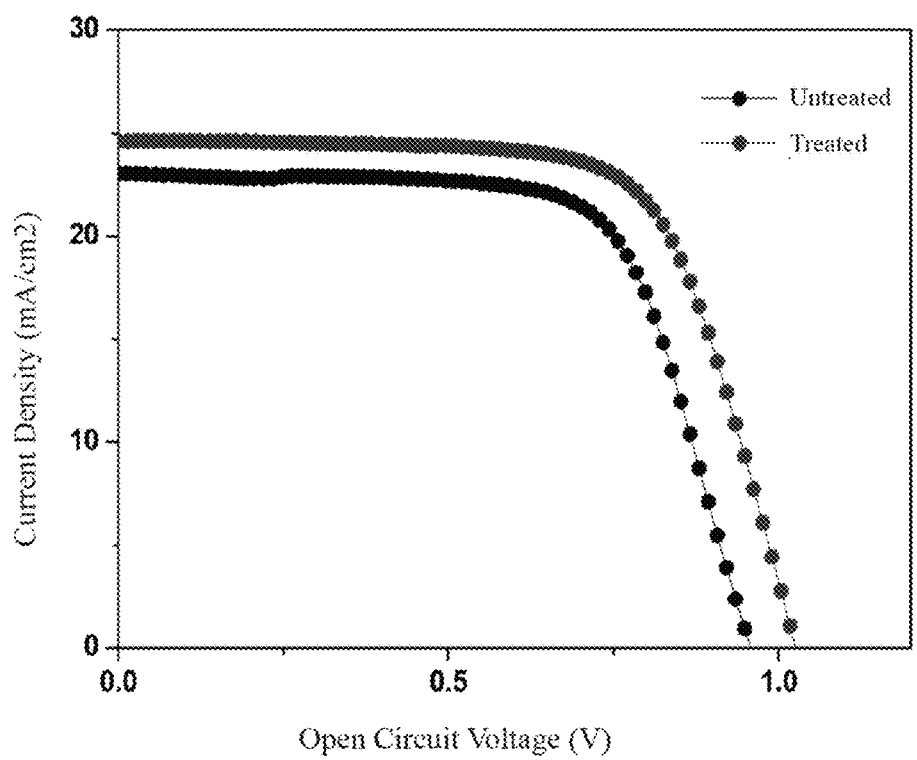
FIG. 2 shows a comparison result of the photoelectric conversion efficiency of the perovskite solar cell treated by 3,4-dichloroaniline and the photoelectric conversion efficiency of the untreated perovskite solar cell.

FIG. 2 shows the photoelectric conversion efficiency of perovskite solar cells (Example 3, FTO) treated by 3,4-dichloroaniline and the photoelectric conversion efficiency of untreated perovskite solar cells (comparison solar cells and FTO). The photoelectric conversion efficiency of untreated perovskite devices was significantly lower than the photoelectric conversion efficiency of perovskite devices treated with 3,4-dichloroaniline. conventional parameters for measuring the performance of the solar cell, open-circuit voltage, the short-circuit, and filling factor, were greatly improved after the perovskite was modified. Therefore, the additive has an optimized effect on perovskite.

Figure 3:
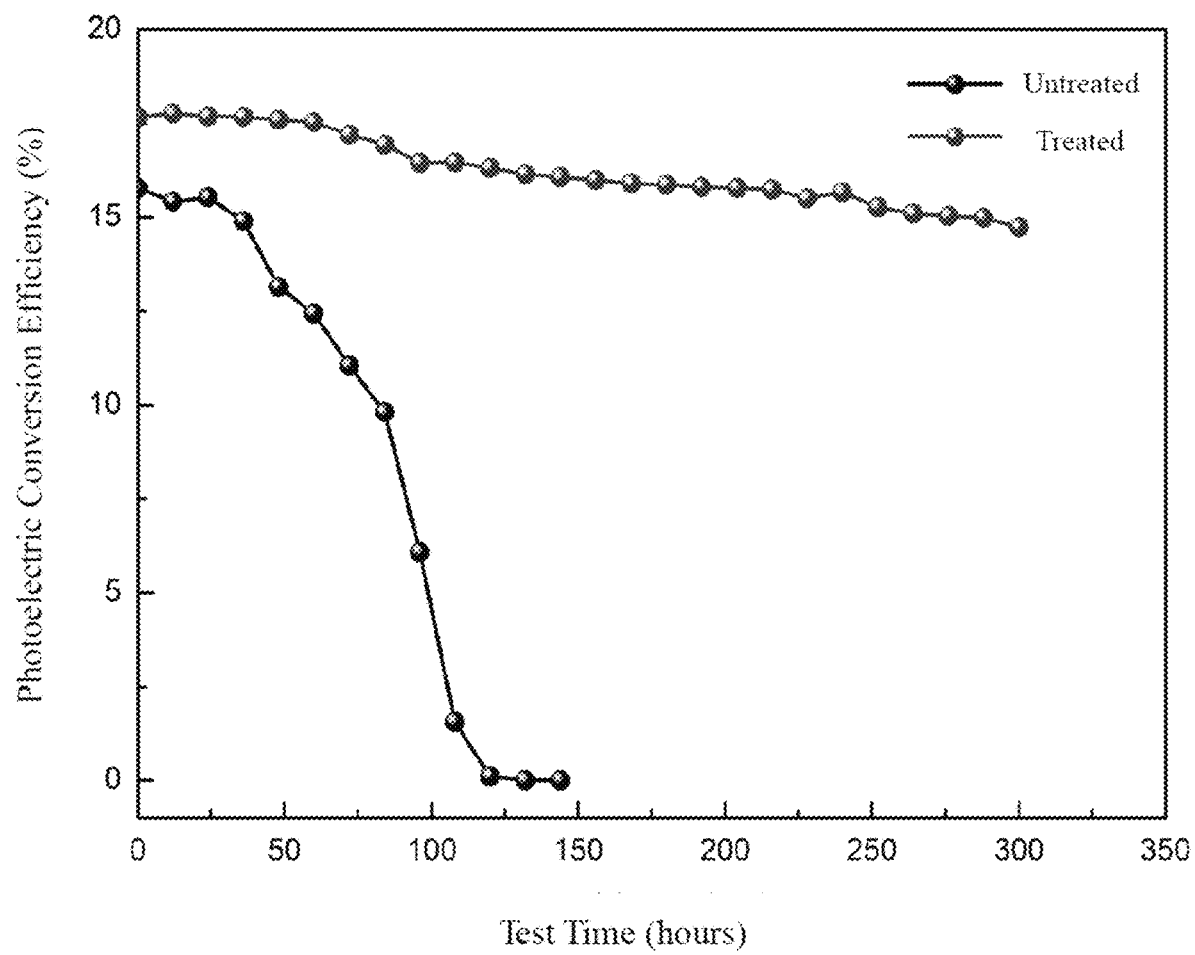
FIG. 3 shows a comparison result of the stability of the untreated perovskite solar cell and the stability of the perovskite solar cell treated with 3,4-dichloroaniline treatment.

FIG. 3 shows a comparison of stability test result (500 hours, humidity: 50%, temperature: 25° C.) of an untreated perovskite solar cell (Comparative Solar Cell, FTO) and a perovskite solar cell treated 3,4-dichloroaniline (Example 3, FTO). After 3,4-dichloroaniline was added, the stability of the perovskite solar cell was greatly improved.

Comparative Example: the perovskite precursor solution for improving the stability of the perovskite solar cell of Example 3 was replaced with the isomer perovskite precursor solution, and the rest was unchanged. The obtained isomer solar cell (FTO) was tested for same stability, and its photoelectric conversion efficiency was reduced from 15.02% of initial (0 h) to 12.58% of 100 h.

The perovskite precursor solution for improving the stability of the perovskite solar cell of Example 3 was replaced with the less perovskite precursor solution, and the rest was unchanged, to obtain an isomer solar cell (FTO). The photoelectric conversion efficiency was reduced from 15.33% of initial (0 h) to 5.68% of 100 h in the same stability test.

The perovskite precursor solution for improving the stability of the perovskite solar cell in Example 3 was replaced with the excess perovskite precursor solution, and the rest was unchanged, to obtain an isomer solar cell (FTO). The photoelectric conversion efficiency was reduced from 14.86% of the initial (0 h) to 8.37% of 100 h in the same stability test.

EXAMPLE 4

Chloride ions affected the film-forming performance of perovskite, and the composition of perovskite also had a key effect on perovskite film performance.

The perovskite precursor solution for improving the stability of the perovskite solar cell included 14.1 mg of bromomethylamine, 155.4 mg of iodoformamidine, 554.3 mg of lead iodide, 47 mg of cesium iodide, 7.32 mg (0.95%) of 3,4-dichloroaniline, 200 mL of dimethyl sulfoxide, and 800 mL of N,N-dimethylformamide, and the preparation method thereof was the same as Example 1.

The solar cell (ITO substrate) was then prepared according to Example 3, tested by the same stability test. The photoelectric conversion efficiency was reduced from 17.46% of initial (0 h) to 17.11% of 72 h, 16.03% of 100 h.

EXAMPLE 5

Chloride ions affected the film-forming performance of perovskite, and the composition of perovskite also had a key effect on perovskite film performance.

The perovskite precursor solution for improving the stability of the perovskite solar cell included 14.1 mg of bromomethylamine, 155.4 mg of iodoformamidine, 524.3 mg of lead iodide, 77 mg of cesium iodide, 7.86 mg (1.02%) of 3,4-dichloroaniline, 200 mL of dimethyl sulfoxide, and 800 mL of N,N-dimethylformamide, and the preparation method of the perovskite precursor solution is the same as Example 1.

The solar cell (FTO substrate) was then prepared according to Example 3, tested by the same stability test. The photoelectric conversion efficiency was reduced from 17.39% of initial (0 h) to 17.02% of 72 h, 16.05% of 100 h.

In Example 5, 3,4-dichloroaniline was replaced with chlormethylamine (MAC1), and the rest was unchanged to obtain an isomer solar cell (FTO), which was tested in the same stability test. The photoelectric conversion efficiency was reduced from 16.93% of initial (0 h) to 14.39% of 72 h, 13.21% of 100 h.

In addition, the untreated perovskite had high humidity and temperature sensitivity to the environment, and high humidity and high temperature caused the untreated perovskite to decay and decompose in an extremely short time. The perovskite treated with 3,4-dichloroaniline had low humidity sensitivity, and can be stored for a long time in a high-humidity environment, which is also a great advantage of the present invention.

The invention claimed is:

1. A perovskite precursor solution for improving the stability of a perovskite solar cell, comprising:
    a perovskite precursor and a solvent,
    wherein the perovskite precursor comprises brommethylamine, iodoformamidine, lead iodide, cesium iodide and 3,4-dichloroaniline; and
    wherein an amount of bromomethylamine, iodo-formamidine, lead iodide and cesium iodide is 100%; an amount of bromomethylamine is 1%-5%, an amount of iodoformamidine is 10%-28%, an amount of lead iodide is 50%-80%, and an amount of cesium iodide is balance;
    and an amount of 3,4-dichloroaniline is 0.6%-1.15% of the amount of bromomethylamine, iodoformamidine, lead iodide, cesium iodide, and cesium iodide.

2. The perovskite precursor solution according to claim 1, wherein the solvent is a mixture of a sulfone solvent and an amide solvent.

3. The perovskite precursor solution according to claim 2, wherein the solvent is a mixture of dimethyl sulfoxide and N,N-dimethylformamide.

4. The perovskite precursor solution according to claim 3, wherein a volume ratio of dimethyl sulfoxide and N,N-dimethylformamide is 1:4.

5. The perovskite precursor solution according to claim 1, wherein a weight ratio of the perovskite precursor and the solvent is 1:(0.8-1.5).

6. The perovskite precursor solution according to claim 1, wherein bromomethyl amine, iodoformamidine, lead iodide, cesium iodide and 3,4-dichloroaniline are mixed with the solvent to obtain the perovskite precursor solution.

7. A perovskite precursor for improving the stability of a perovskite solar cell, comprising bromomethylamine, iodoformamidine, lead iodide, cesium iodide, and 3,4-dichloroaniline, wherein an amount of methylamine, iodoformamidine, lead iodide and cesium iodide is 100%; an amount of bromomethylamine is 1%-5%, an amount of iodoformamidine is 10%-28%, an amount of lead iodide is 50%-80%, and an amount of cesium iodide is balance; an amount of 3.4-dichloroaniline is 0.6%-1.15% of the amount of bromomethylamine, iodoformamidine, lead iodide, cesium iodide, and cesium iodide.

* * * * *